(12) United States Patent
Liu et al.

(10) Patent No.: US 10,700,152 B2
(45) Date of Patent: Jun. 30, 2020

(54) DISPLAY PANEL AND DISPLAY DEVICE

(71) Applicant: WuHan TianMa Micro-Electronics Co., Ltd., Wuhan (CN)

(72) Inventors: Xinzhao Liu, Wuhan (CN); Kaihong Huang, Wuhan (CN); Min Chen, Wuhan (CN); Jiayao Yang, Wuhan (CN); Lin Cheng, Wuhan (CN); Yana Gao, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 16/261,658

(22) Filed: Jan. 30, 2019

(65) Prior Publication Data
US 2020/0144351 A1    May 7, 2020

(30) Foreign Application Priority Data

Nov. 1, 2018   (CN) .......................... 2018 1 1294592

(51) Int. Cl.
*H01L 51/52*    (2006.01)
*H01L 27/32*    (2006.01)

(52) U.S. Cl.
CPC ...... *H01L 27/3276* (2013.01); *H01L 51/5246* (2013.01)

(58) Field of Classification Search
CPC ............. H01L 27/3276; H01L 27/3279; H01L 51/5246; G02F 1/136286;
(Continued)

(56) References Cited

U.S. PATENT DOCUMENTS

2008/0197778 A1* 8/2008 Kubota ............... H01L 27/3258
                                                              315/73
2017/0098797 A1* 4/2017 Eom ................... H01L 27/3276
(Continued)

FOREIGN PATENT DOCUMENTS

| CN | 106653819 A | 5/2017 |
| CN | 107565046 A | 1/2018 |
| CN | 108011051 A | 5/2018 |

OTHER PUBLICATIONS

Chinese OA dated Mar. 4, 2020 for corresponding CN Application No. 201811294592.7.

*Primary Examiner* — Eric A. Ward
(74) *Attorney, Agent, or Firm* — Tarolli, Sundheim, Covell & Tummino LLP (57) ABSTRACT

A display panel and a display device are provided. The display panel has a display region and a peripheral region surrounding the display region. The display panel includes: a scan driving circuit arranged in the peripheral region; a low-level voltage signal line arranged in the peripheral region and electrically connected to the scan driving circuit; an auxiliary metal line arranged in the peripheral region and electrically connected to the low-level voltage signal line. The peripheral region includes a first and second peripheral region located on opposite sides of the display region in a first direction, and a third and fourth peripheral region located on opposite sides of the display region in a second direction, the first direction being perpendicular to the second direction. The auxiliary metal line at least extends in the first, third and second peripheral region to form a structure partially surrounding the display region.

16 Claims, 9 Drawing Sheets

(58) Field of Classification Search
CPC .......... G02F 2001/13629; G02F 2001/136295; G09G 3/3233; G09G 3/3241; G09G 3/325; G09G 3/3266; G09G 3/3275; G09G 3/3283; G09G 3/3291; G09G 2310/0281
See application file for complete search history.

(56) References Cited

U.S. PATENT DOCUMENTS

| | | | |
|---|---|---|---|
| 2017/0294500 A1* | 10/2017 | Song | H01L 27/3248 |
| 2018/0337364 A1* | 11/2018 | Kwon | H01L 51/5246 |
| 2019/0229176 A1* | 7/2019 | Shim | H01L 51/5234 |
| 2019/0279575 A1* | 9/2019 | Kim | G09G 3/3225 |
| 2020/0058241 A1* | 2/2020 | Moon | G09G 3/3225 |
| 2020/0066196 A1* | 2/2020 | Hao | G01N 27/00 |

* cited by examiner

DISPLAY PANEL AND DISPLAY DEVICE

CROSS-REFERENCE TO RELATED APPLICATIONS

The present application claims priority to Chinese Patent Application No. 201811294592.7, filed on Nov. 1, 2018, the content of which is incorporated herein by reference in its entirety.

TECHNICAL FIELD

The present disclosure relates to the field of display technologies, and in particular, to a display panel and a display device.

BACKGROUND

A display panel has a circuit for driving the display panel to emit light, and a low-level voltage signal is a signal required by the circuit. For example, usually it requires a low-level voltage signal and other signals together to achieve controlling of a scan driving circuit. Therefore, a low-level voltage signal line should be provided in the display panel to achieve transmission of the low-level voltage signal.

However, after testing the display panel, it is found that during the working process of the display panel, a panel film layer nearby the low-level voltage signal line is prone to be damaged due to a large amount of heat generated by the low-level voltage signal line, resulting in access of external water and oxygen and thus causing corrosion of the panel.

SUMMARY

The present disclosure provides a display panel and a display device, which can reduce heat generated by the low-level voltage signal line, thereby reducing a probability of panel corrosion caused by the large amount of heat generated by the low-level voltage signal line.

In an aspect, the present disclosure provides a display panel, having a display region and a peripheral region surrounding the display region. The display panel includes: a scan driving circuit arranged in the peripheral region; a low-level voltage signal line arranged in the peripheral region and electrically connected to the scan driving circuit; and an auxiliary metal line arranged in the peripheral region and electrically connected to the low-level voltage signal line. The peripheral region includes a first peripheral region and a second peripheral region that are located on opposite sides of the display region in a first direction, and a third peripheral region and a fourth peripheral region that are located on opposite sides of the display region in a second direction. The first direction is perpendicular to the second direction. The auxiliary metal line at least extends in the first peripheral region, the third peripheral region, and the second peripheral region to form a structure partially surrounding the display region.

In another aspect, the present disclosure provides a display device including any of the display panels disclosed in the present disclosure.

BRIEF DESCRIPTION OF DRAWINGS

In order to illustrate technical solutions in embodiments of the present disclosure, the accompanying drawings used in the embodiments and in the related art are briefly introduced as follows. It should be noted that the drawings described as follows are merely part of the embodiments of the present disclosure, other drawings can also be acquired by those skilled in the art without paying creative efforts.

DESCRIPTION OF EMBODIMENTS

In order to make the purpose, technical solutions, and advantages of the embodiments of the present disclosure to be understandable, the technical solutions in the embodiments of the present disclosure are described in the following with reference to the accompanying drawings. It should be understood that the described embodiments are merely exemplary embodiments of the present disclosure, which shall not be interpreted as providing limitations to the present disclosure. All other embodiments obtained by those skilled in the art without creative efforts according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

Figure 1:
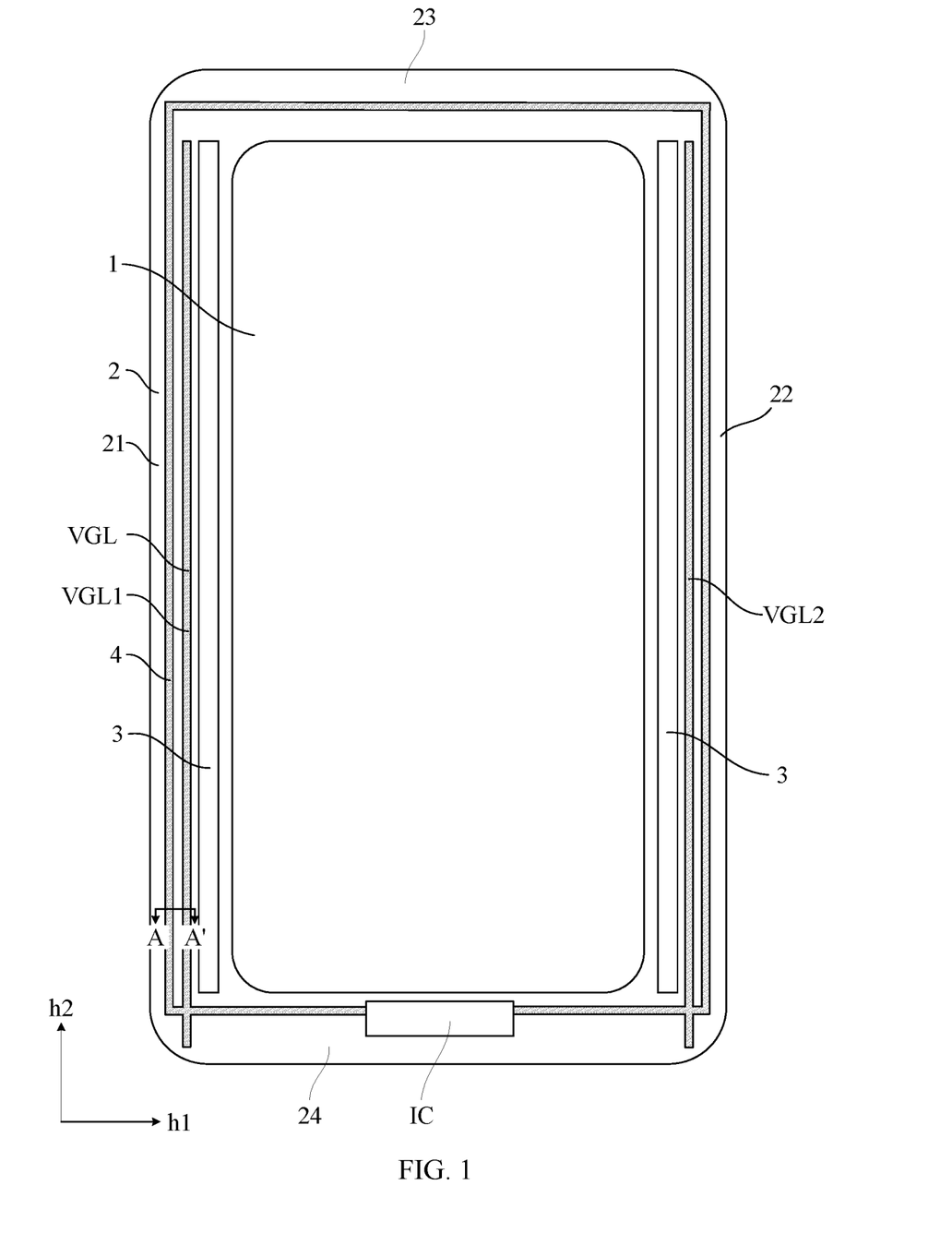
FIG. 1 is a schematic structural diagram of a display panel according to an embodiment of the present disclosure.

FIG. 1 is a schematic structural diagram of a display panel according to an embodiment of the present disclosure. As shown in FIG. 1, the display panel is divided into a display region 1 and a peripheral region 2 surrounding the display region 1. The display panel includes: a scan driving circuit 3 arranged in the peripheral region 2; a low-level voltage signal line VGL arranged in the peripheral region 2 and electrically connected to the scan driving circuit 3; an auxiliary metal line 4 arranged in the peripheral region 2 and electrically connected to the low-level voltage signal line VGL. The peripheral region 2 includes a first peripheral region 21 and a second peripheral region 22 located on opposite sides of the display region 1 in a first direction h1. The peripheral region 2 further includes a third peripheral region 23 and a fourth peripheral region 24 located on opposite sides of the display region 1 in a second direction h2. Herein, the first direction h1 is perpendicular to the second direction h2. The auxiliary metal line 4 is connected in sequence at least in the first peripheral region 21, the third peripheral region 23, and the second peripheral region 22, so as to form a structure partially surrounding the display region 1.

The scan driving circuit 3 is configured to provide a scan signal for the circuit in the display region 1. The scan driving circuit 3 needs a low level provided by the low-level voltage signal line VGL. For example, for a bilaterally driven display panel, the scan driving circuit is provided in both the first peripheral region 21 and the second peripheral region 22. Therefore, the low-level voltage signal line VGL is provided in both the first peripheral region 21 and the second peripheral region 22. The auxiliary metal line 4 at least partially surrounding the display region 1 is electrically connected to the low-level voltage signal line VGL, that is, the low-level voltage signal line VGL is connected in parallel to a resistor.

For the display panel provided by this embodiment of the present disclosure, the auxiliary metal line at least partially surrounding the display region is arranged in the peripheral region of the display panel, and the auxiliary metal line is electrically connected to the low-level voltage signal line, that is, the low-level voltage signal line is connected in parallel to a resistor. During the working process of the display panel, heat generation on the low-level voltage signal line is reduced, thereby reducing the probability of panel corrosion due to a large amount of heat generation of the low-level voltage signal line. In addition, the auxiliary metal line being served as a parallel resistor of the low-level voltage signal line can also reduce the load of the scan driving circuit, thereby improving the driving capability of the display panel.

Figure 2:
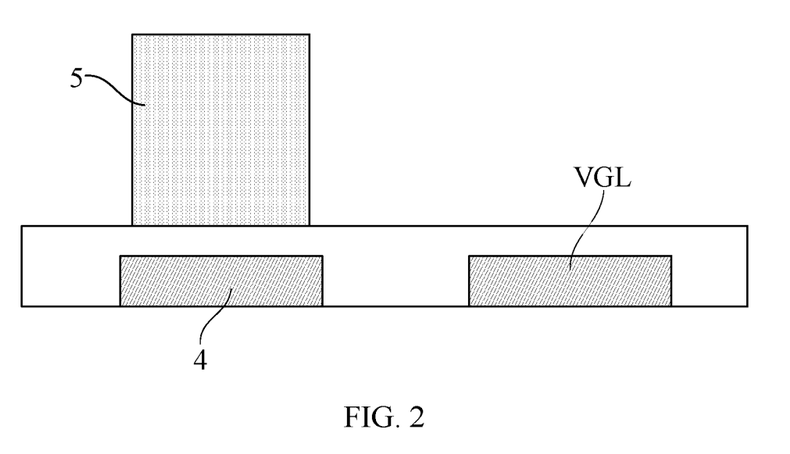
FIG. 2 is a schematic cross-sectional view along line AA' of FIG. 1.

FIG. 2 is a schematic cross-sectional view along line AA' of FIG. 1. In an embodiment, as shown in FIG. 2, the display panel further includes: a frame sealant 5 located in the peripheral region 2. The auxiliary metal line 4 at least partially overlaps the frame sealant 5 in a direction perpendicular to a plane of the display panel.

The frame sealant 5 is disposed at least in the first peripheral region 21, the second peripheral region 22, and the third peripheral region 23. The frame sealant 5 is configured to seal the display panel to prevent ambient water and oxygen from eroding the devices in the display region 1. In the process of making the frame sealant 5, for better solidification of the frame sealant 5, a metal overlapping the frame sealant 5 may be provided in the direction perpendicular to the plane of the display panel, that is, the auxiliary metal line 4 in the structure corresponding to FIG. 2 overlapping the frame sealant 5 provided in the direction perpendicular to the plane of the display panel. Since the auxiliary metal line 4 is located below the frame sealant 5, when light from above irradiates the frame sealant 5, the auxiliary metal line 5 can reflect the light onto the frame sealant 5, and the frame sealant 5 will be solidified when it is irradiated with light. Therefore, the auxiliary metal line 4 can improve the solidification effect of the frame sealant 5. Moreover, the auxiliary metal line 4 is electrically connected to the low-level voltage signal line VGL, so that the low-level voltage signal line VGL is connected in parallel to a resistor, thereby reducing heat generation of the low-level voltage signal line VGL, and thus reducing the probability of panel corrosion due to a large amount of heat generation of the low-level voltage signal line.

In an embodiment, as shown in FIG. 1 and FIG. 2, the scan driving circuit 3 is located between the auxiliary metal line 4 and the display region 1.

The scan driving circuit 3 is configured to provide a scan signal for the devices in the display region 1, and the auxiliary metal line 4 is used as the reflective metal for the frame sealant 5, therefore, the frame sealant 5 and the auxiliary metal line 4 are disposed on the periphery of the scan driving circuit 3, so that the scan driving circuit 3 can be sealed at the same time, thereby preventing ambient water and oxygen from eroding the scan driving circuit 3.

In an embodiment, as shown in FIG. 1 and FIG. 2, a driving chip IC or a flexible circuit board (not shown in FIG. 1) is arranged in the fourth peripheral region 24. The driving chip IC or the flexible circuit board is electrically connected to the low-level voltage signal line VGL in the fourth peripheral region 24. The auxiliary metal line 4 is electrically connected to low-level voltage signal line VGL in the fourth peripheral region 24.

The driving chip IC or the flexible circuit board is used to provide an initial low-level voltage for the low-level voltage signal line VGL. The driving chip IC or the flexible circuit board is usually arranged in the fourth peripheral region 24. Therefore, when the auxiliary metal line 4 is electrically connected to the low-level voltage signal line VGL in the fourth peripheral region 24, that is, when the auxiliary metal line 4 is disposed closer to a position where the initial low-level voltage is transmitted to the low-level voltage signal line VGL, it brings a better effect in reducing the overall heat generation of the low-level voltage signal line VGL.

Figure 3:
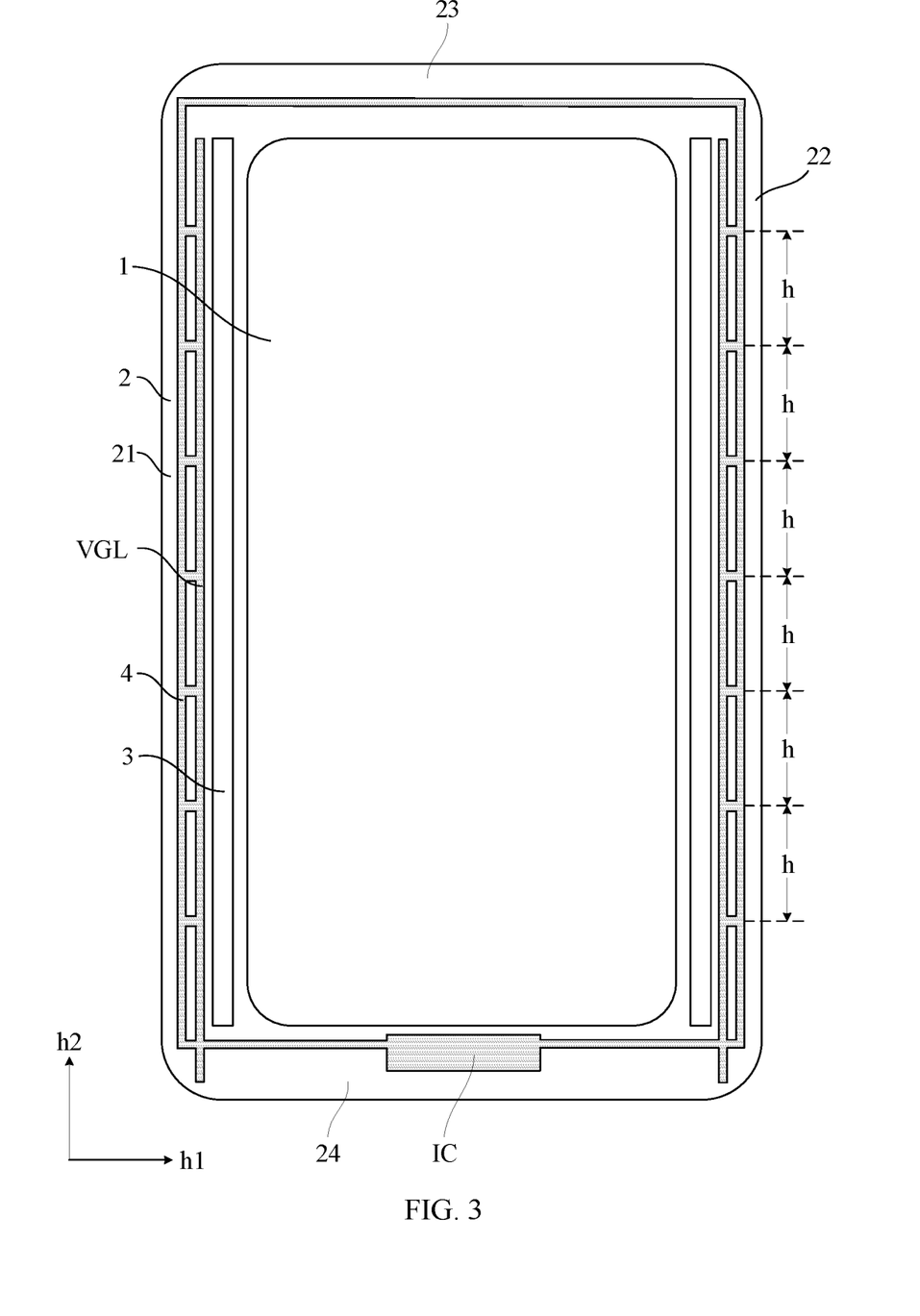
FIG. 3 is a schematic structural diagram of another display panel according to an embodiment of the present disclosure.

FIG. 3 is a schematic structural diagram of another display panel according to an embodiment of the present disclosure. In an embodiment, as shown in FIG. 3, in the first peripheral region 21 and/or the second peripheral region 22, in the second direction h2, the auxiliary metal line 4 is electrically connected to the low-level voltage signal line VGL at multiple connection positions.

The low-level voltage signal line VGL in the first peripheral region 21 and the second peripheral region 22 each extends along the second direction h2. Therefore, the auxiliary metal line 4 is electrically connected to the low-level voltage signal line VGL at multiple connection positions in the second direction h2, so that the voltage on the low-level voltage signal line VGL at each position is balanced by the peripheral auxiliary metal line 4, and thus the voltage drop variation is alleviated during the transmission of the low-level signal on the low-level voltage signal line VGL, thereby improving the display uniformity of the display panel.

In an embodiment, as shown in FIG. 3, in the second direction h2, for the multiple connection positions, every two adjacent connection positions have a same distance, thereby further reducing the variation of the voltage drop on the low-level voltage signal line VGL.

Figure 4:
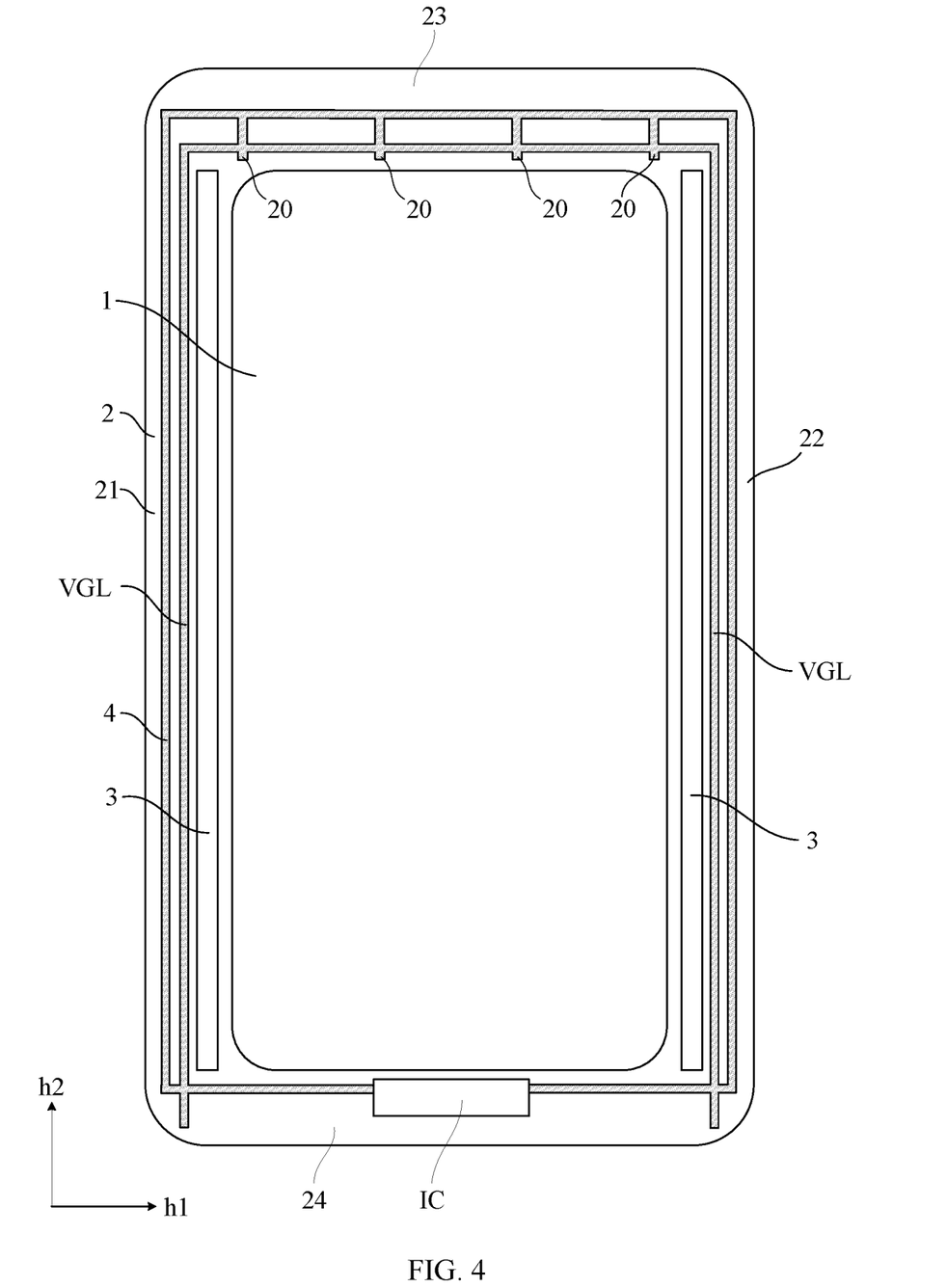
FIG. 4 is a schematic structural diagram of still another display panel according to an embodiment of the present disclosure.

FIG. 4 is a schematic structural diagram of still another display panel according to an embodiment of the present disclosure. In an embodiment, as shown in FIG. 4, an electrostatic discharge circuit (not shown in FIG. 4) is arranged in the third peripheral region 23. The electrostatic discharge circuit includes a low-level voltage terminal 20, and the low-level voltage terminal 20 is electrically connected to the low-level voltage signal line VGL. The auxiliary metal line 4 is electrically connected to the low-voltage terminal 20 in the third peripheral region 23.

The electrostatic discharge circuit is configured to discharge a large voltage in the display panel, so it is necessary to be connected to the low-level voltage signal line VGL, that is, the low-level voltage terminal 20 is provided in the third peripheral region 23, both the low-level voltage signal line VGL and the auxiliary metal line 4 are electrically connected to the low-level voltage terminal 20 in the third peripheral region 23. In other words, the auxiliary metal line 4 is electrically connected to the low-level voltage signal line VGL in the third peripheral region 23. In this way, it is not necessary to electrically connect the low-level voltage signal line VGL to the auxiliary metal line 4 in the first peripheral region 21 and the second peripheral region 22, so that the frame space of the first peripheral region 21 and the second peripheral region 22 can be saved.

In an embodiment, as shown in FIG. 1, the low-level voltage signal line VGL includes a first low-level voltage signal line VGL1 located in the first peripheral region 21 and a second low-level voltage signal line VGL2 located in the second peripheral region 22. It should be understood that in other implementable embodiments, if the display panel is unilaterally driven, i.e., the scan driving circuit is merely arranged in the first peripheral region and not arranged in the second peripheral region, the low-level voltage signal line is arranged in the corresponding first peripheral region and not arranged in the second peripheral region.

Figure 5:
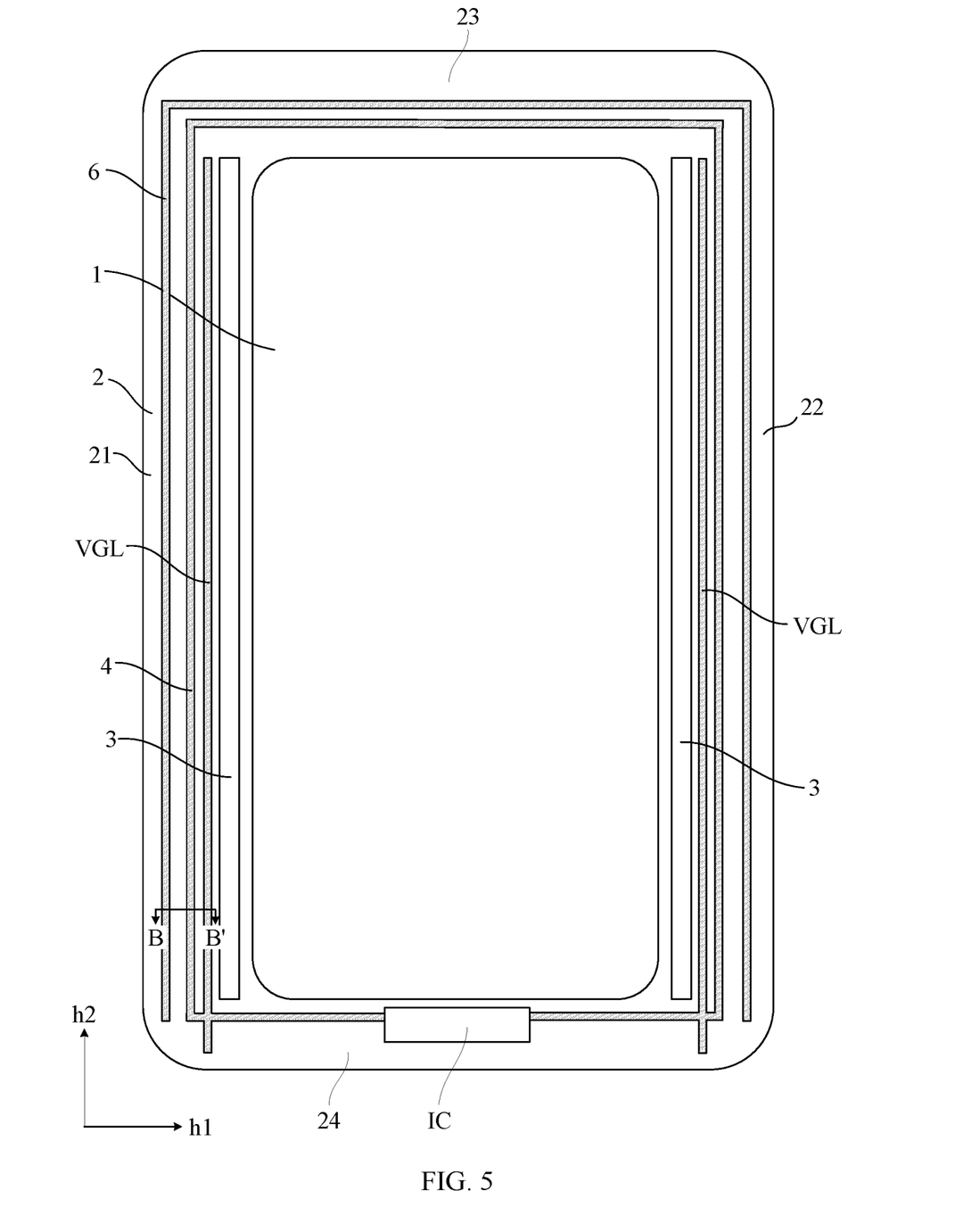
FIG. 5 is a schematic structural diagram of yet another display panel according to an embodiment of the present disclosure.
Figure 6:
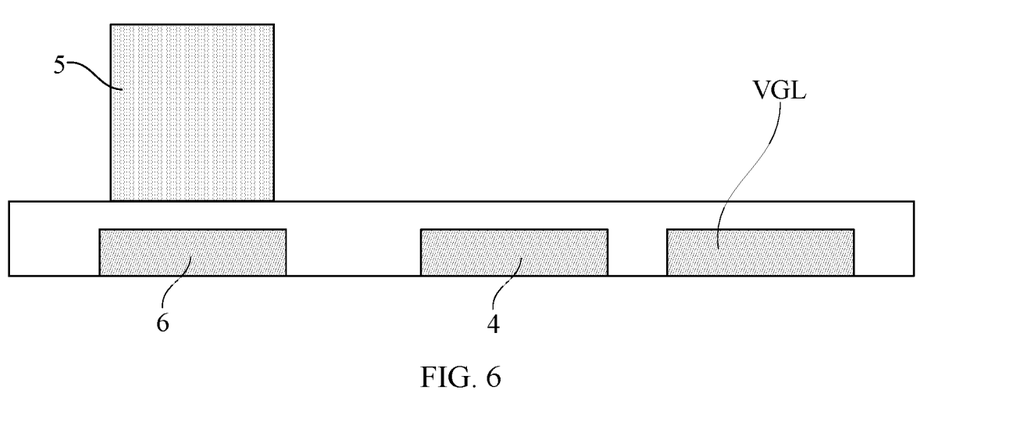
FIG. 6 is a schematic cross-sectional view along line BB' of FIG. 5.

FIG. 5 is a schematic structural diagram of yet another display panel according to an embodiment of the present disclosure; and FIG. 6 is a schematic cross-sectional view along line BB' of FIG. 5. In an embodiment, as shown in FIG. 5 and FIG. 6, the display panel further includes: a frame sealant 5 located in the peripheral region 2; an auxiliary sealing metal line 6 located in the peripheral region 2, and the auxiliary sealing metal line 6 is sequentially connected at least in the first peripheral region 21, the third peripheral region 23, and the second peripheral region 22 to form a structure partially surrounding the display region 1. The auxiliary sealing metal line 6 at least partially overlaps the frame sealant 5 in the direction perpendicular to the plane of the display panel.

In the structure shown in FIG. 5 and FIG. 6, the auxiliary sealing metal line 6 is used to reflect light during manufacturing the frame sealant 5, thereby improving the solidification effect of the frame sealant 5, and the auxiliary metal line 4 is merely used as a parallel resistor of the low-level voltage signal line VGL.

In an embodiment, as shown in FIG. 5 and FIG. 6, the auxiliary sealing metal line 6 is connected to ground for guiding out the static electricity of the display panel. Compared with the structure corresponding to FIG. 2, it avoids that the reflective metal of the frame sealant 5 is directly electrically connected to the low-level voltage signal line VGL and thereby causing the static electricity of the display panel to be transmitted to the scan driving circuit 3 through the low-level voltage signal line VGL, resulting in device breakdown, in other word, the electrostatic protection capability is improved accordingly.

In an embodiment, as shown in FIG. 5 and FIG. 6, the display panel includes a plurality of organic light-emitting diodes (not shown) in the display region 1. The auxiliary sealing metal line 6 is electrically connected to a cathode voltage signal line of the plurality of organic light-emitting diodes. The auxiliary sealing metal line 6 at least partially surrounds the display region. The peripheral region 2 is provided with a power supply line that is electrically connected to the cathode of a respective one of the plurality of organic light-emitting diodes, for example, a metal line (not shown) that is sequentially connected in the first peripheral region 21, the third peripheral region 23, and the second peripheral region 22 and partially surrounds the display region, the auxiliary sealing metal line 6 is electrically connected to the metal line for providing a cathode voltage for the power supply line in the display region 1. Respective cathodes of the organic light-emitting diodes at each position in the display region 1 require a same cathode voltage, therefore, the auxiliary sealing metal line 6 being served as the cathode voltage signal line can allow the voltage on the power line at different positions to be more uniform.

Figure 7:
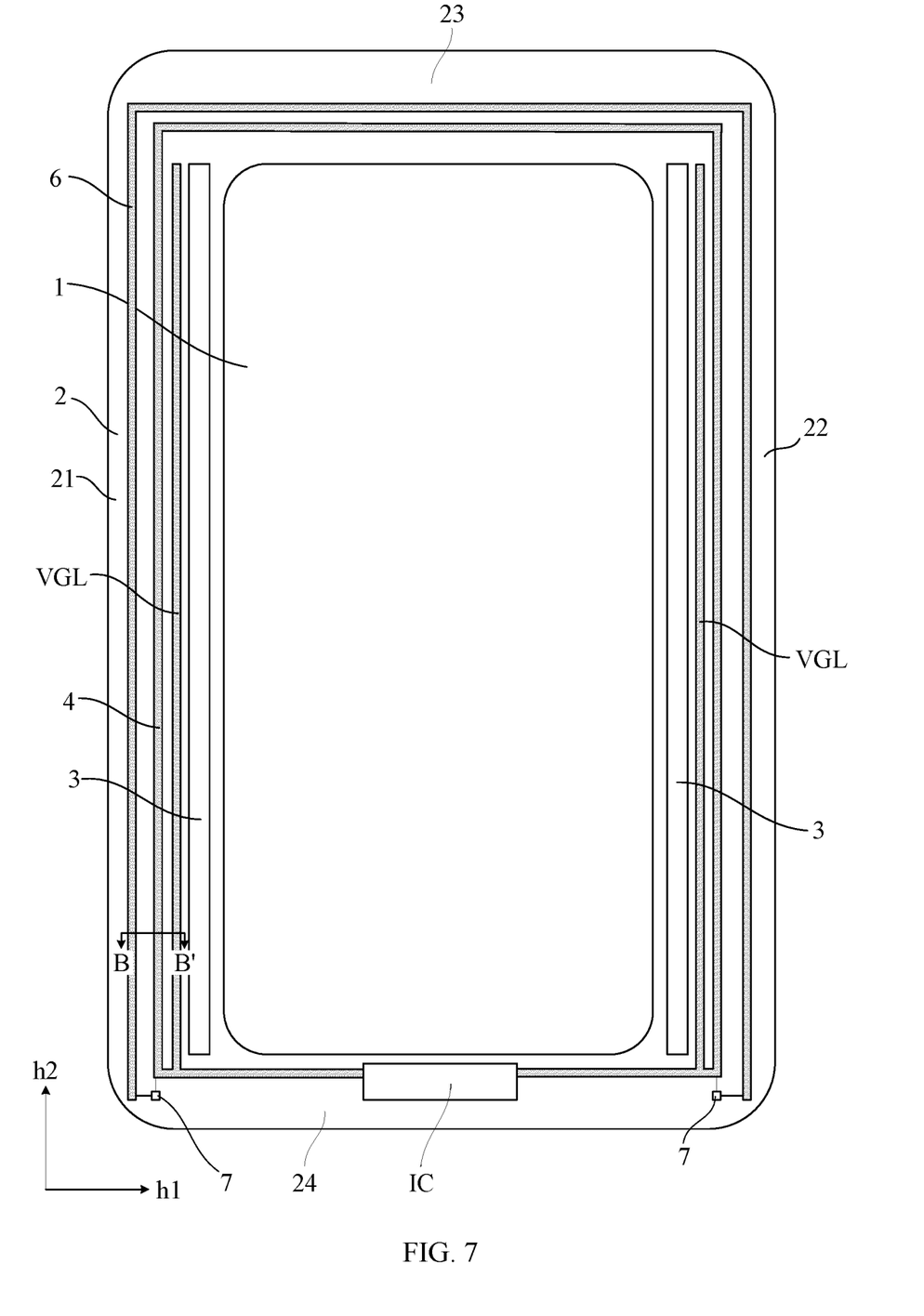
FIG. 7 is a schematic structural diagram of another display panel corresponding to FIG. 6.

FIG. 7 is a schematic structural diagram of another display panel corresponding to FIG. 6. In an embodiment, as shown in FIG. 7, the structure shown in FIG. 7 is basically the same as the structure shown in FIG. 5, except that in the structure shown in FIG. 7, the auxiliary sealing metal line 6 is electrically connected to the auxiliary metal line 4 through a switch unit 7. When a higher electrostatic protection capability is required, the switch unit 7 is controlled to be turned off, and the auxiliary sealing metal line 6 is connected to ground. When the low-level voltage signal line VGL is required to be connected to a larger resistor to further reduce the heat generation, the switch unit 7 is controlled to be turned on, and the auxiliary sealing metal line 6 is not connected to ground but is instead electrically connected to the auxiliary metal line 4 through the switch unit 7, in this case, the auxiliary sealing metal line 6 and the auxiliary metal line 4 together serve as a parallel resistor of the low-level voltage signal line VGL.

In an embodiment, the auxiliary metal line 4 is disposed in the same layer as any of the metal layers in the scan driving circuit 3.

Figure 8:
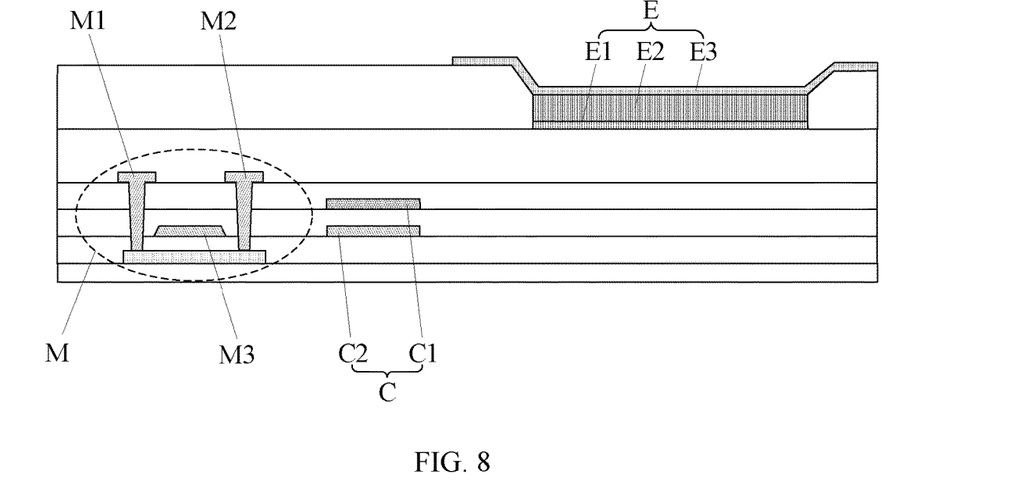
FIG. 8 is a schematic cross-sectional view of a partial region according to an embodiment of the present disclosure.

FIG. 8 is a schematic cross-sectional view of a partial region in an embodiment of the present disclosure. In an example, as shown in FIG. 8, the scan driving circuit includes a signal line, a thin film transistor M and a capacitor C. The capacitor C has a first metal electrode C1 and a second metal electrode C2. The thin film transistor M has a metal source electrode M1, a metal drain electrode M2 and a metal gate electrode M3. All these metal structures need to be formed in the metal layers. Therefore, the auxiliary metal line 4 can be disposed in the same layer as any of the metal layers in the scan driving circuit 3, and is formed by a same patterning process, thereby saving process cost. Moreover, FIG. 8 also shows an organic light-emitting diode E in the display region, and the organic light-emitting diode E includes an anode E1, an organic light-emitting layer E2 and a cathode E3 that are stacked. A voltage is respectively supplied to the anode E1 and to the cathode E3, so that the electrons and holes are combined to emit light in the organic light-emitting layer E2, thereby achieving the display function.

Figure 9:
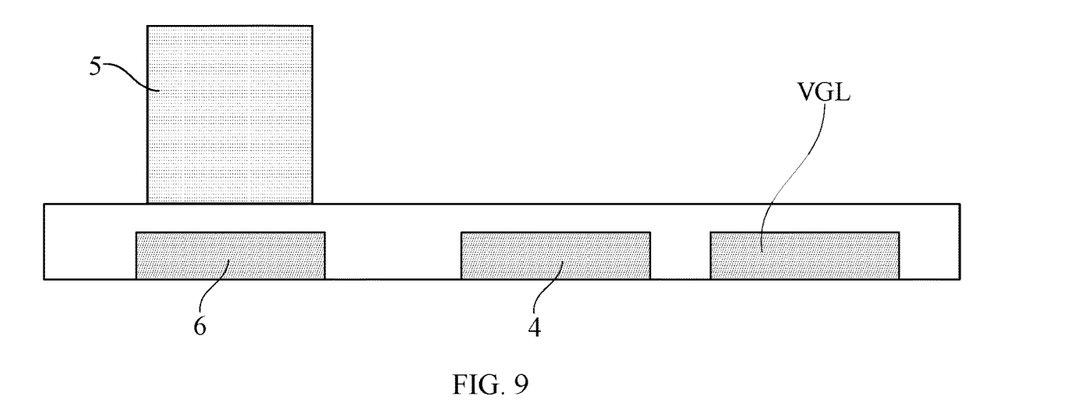
FIG. 9 is a another schematic cross-sectional view along line BB' of FIG. 5 or FIG. 7.

FIG. 9 is another schematic cross-sectional view along line BB' of FIG. 5 or FIG. 7. In an embodiment, as shown in FIG. 9, the auxiliary metal line 4 and the low-level voltage signal line VGL are arranged in a same layer. In this case, the electrical connection between the auxiliary metal line 4 and the low-level voltage signal line VGL can be directly formed by a same patterning process, thereby saving process cost.

In an embodiment, the auxiliary metal line 4 and the low-level voltage signal line VGL are arranged in different metal layers. It should be noted that FIG. 2, FIG. 6 and FIG. 9 merely illustrate the structure in which the auxiliary metal line 4 and the low-level voltage signal line VGL are arranged in a same layer, and the schematic diagram illustrating that the auxiliary metal line 4 and the low-level voltage signal line VGL may be arranged in different metal layers is omitted.

Figure 10:
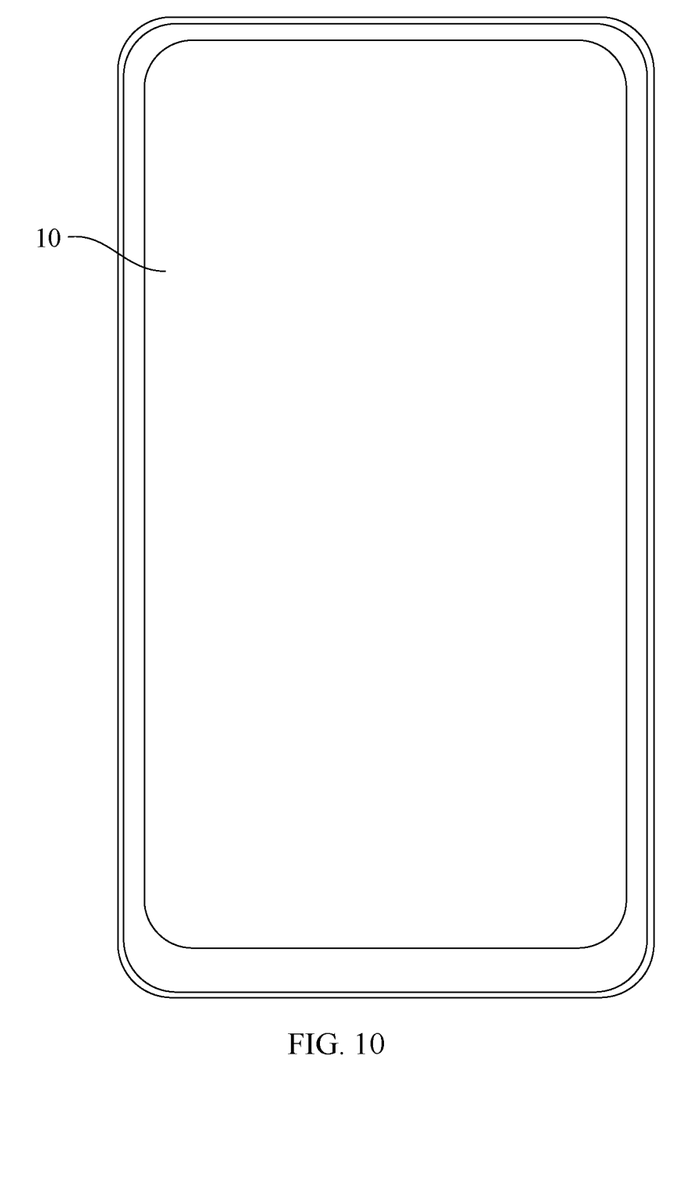
FIG. 10 is a schematic structural diagram of a display device according to an embodiment of the present disclosure.

FIG. 10 is a schematic structural diagram of a display device according to an embodiment of the present disclosure. As shown in FIG. 10, an embodiment of the present disclosure further provides a display device including the abovementioned display panel 10.

The structure and principle of the display panel 10 are the same as those of the abovementioned embodiments, and details are not further described herein. The display device may be any electronic device having a display function, such as a touch display screen, a cellphone, a tablet computer, a laptop computer, an electronic paper book, or a television.

For the display device provided by this embodiment of the present disclosure, the auxiliary metal line at least partially surrounding the display region is arranged at the periphery of the display panel, and the auxiliary metal line is electrically connected to the low-level voltage signal line, that is, the low-level voltage signal line is connected in parallel to a resistor. During the working process of the display panel, heat generation on the low-level voltage signal line is reduced, thereby reducing the probability of panel corrosion due to a large amount of heat generation of the low-level voltage signal line.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

Finally, it should be noted that, the above-described embodiments are merely for illustrating the present disclosure but not intended to provide any limitation. Although the present disclosure has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. A display panel, having a display region and a peripheral region surrounding the display region, wherein the display panel comprises:
    a scan driving circuit arranged in the peripheral region;
    a low-level voltage signal line arranged in the peripheral region and electrically connected to the scan driving circuit; and
    an auxiliary metal line arranged in the peripheral region and electrically connected to the low-level voltage signal line,
    wherein the peripheral region comprises a first peripheral region and a second peripheral region that are located on opposite sides of the display region in a first direction, and a third peripheral region and a fourth peripheral region that are located on opposite sides of the display region in a second direction, the first direction is perpendicular to the second direction; and
    the auxiliary metal line at least extends in the first peripheral region, the third peripheral region, and the second peripheral region to form a structure partially surrounding the display region,
    wherein the display panel further comprises:
    a frame sealant arranged in the peripheral region; and
    an electrostatic discharge circuit arranged in the third peripheral region, the electrostatic discharge circuit comprising a low-level voltage terminal electrically connected to the low-level voltage signal line,
    wherein the auxiliary metal line at least partially overlaps the frame sealant in a direction perpendicular to a plane of the display panel, and
    wherein the auxiliary metal line is electrically connected to the low-level voltage terminal in the third peripheral region.

2. The display panel according to claim 1, wherein the scan driving circuit is located between the auxiliary metal line and the display region.

3. The display panel according to claim 1, further comprising:
    a driving chip or a flexible circuit board arranged in the fourth peripheral region, wherein the driving chip or the flexible circuit board is electrically connected to the low-level voltage signal line in the fourth peripheral region; and
    the auxiliary metal line is electrically connected to the low-level voltage signal line in the fourth peripheral region.

4. The display panel according to claim 1, wherein in the first peripheral region and/or the second peripheral region, the auxiliary metal line is electrically connected to the low-level voltage signal line at a plurality of connection positions along the second direction.

5. The display panel according to claim 4, wherein in the second direction, every two adjacent connection positions are separated by a same distance.

6. The display panel according to claim 1, wherein the low-level voltage signal line comprises a first low-level voltage signal line located in the first peripheral region and a second low-level voltage signal line located in the second peripheral region.

7. The display panel according to claim 1, further comprising:
    an auxiliary sealing metal line arranged in the peripheral region,
    wherein the auxiliary sealing metal line at least extends in the first peripheral region, the third peripheral region, and the second peripheral region to form a structure partially surrounding the display region; and
    the auxiliary sealing metal line at least partially overlaps the frame sealant in a direction perpendicular to a plane of the display panel.

8. The display panel according to claim 7, wherein the auxiliary sealing metal line is connected to ground.

9. The display panel according to claim 7, further comprising:
    a plurality of organic light-emitting diodes arranged in the display region;
    wherein the auxiliary sealing metal line is electrically connected to a cathode voltage signal line of the plurality of organic light-emitting diodes.

10. The display panel according to claim 7, wherein the auxiliary sealing metal line is electrically connected to the auxiliary metal line through a switch unit.

11. The display panel according to claim 1, wherein the scan driving circuit comprises at least one metal layer, and the auxiliary metal line is disposed in one of the at least one metal layer of the scan driving circuit.

12. The display panel according to claim 11, wherein the auxiliary metal line and the low-level voltage signal line are arranged in a same metal layer.

13. The display panel according to claim 11, wherein the auxiliary metal line and the low-level voltage signal line are arranged in different metal layers.

14. A display device, comprising:
a display panel having a display region and a peripheral region surrounding the display region, wherein the display panel comprises:
a scan driving circuit arranged in the peripheral region;
a low-level voltage signal line arranged in the peripheral region and electrically connected to the scan driving circuit; and
an auxiliary metal line arranged in the peripheral region and electrically connected to the low-level voltage signal line,
wherein the peripheral region comprises a first peripheral region and a second peripheral region that are located on opposite sides of the display region in a first direction, and a third peripheral region and a fourth peripheral region that are located on opposite sides of the display region in a second direction, the first direction is perpendicular to the second direction; and
the auxiliary metal line at least extends in the first peripheral region, the third peripheral region, and the second peripheral region to form a structure partially surrounding the display region,
wherein the display panel further comprises:
a frame sealant arranged in the peripheral region; and
an electrostatic discharge circuit arranged in the third peripheral region, the electrostatic discharge circuit comprising a low-level voltage terminal electrically connected to the low-level voltage signal line,
wherein the auxiliary metal line at least partially overlaps the frame sealant in a direction perpendicular to a plane of the display panel, and
wherein the auxiliary metal line is electrically connected to the low-level voltage terminal in the third peripheral region.

15. The display device according to claim 14, wherein the display panel further comprises:
a driving chip or a flexible circuit board arranged in the fourth peripheral region,
wherein the driving chip or the flexible circuit board is electrically connected to the low-level voltage signal line in the fourth peripheral region; and
the auxiliary metal line is electrically connected to the low-level voltage signal line in the fourth peripheral region.

16. The display device according to claim 14, wherein in the first peripheral region and/or the second peripheral region, the auxiliary metal line is electrically connected to the low-level voltage signal line at a plurality of connection positions along the second direction.

* * * * *